(12) United States Patent
Hao

(10) Patent No.: US 9,646,995 B2
(45) Date of Patent: May 9, 2017

(54) FFS ARRAY SUBSTRATE AND LIQUID CRYSTAL DISPLAY DEVICE HAVING THE SAME

(71) Applicant: SHENZHEN CHINA STAR OPTOELECTRONICS TECHNOLOGY CO., LTD., Guangdong (CN)

(72) Inventor: Sikun Hao, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 177 days.

(21) Appl. No.: 14/418,611

(22) PCT Filed: Dec. 25, 2014

(86) PCT No.: PCT/CN2014/094911
§ 371 (c)(1),
(2) Date: Jan. 30, 2015

(87) PCT Pub. No.: WO2016/095252
PCT Pub. Date: Jun. 23, 2016

(65) Prior Publication Data
US 2016/0181286 A1    Jun. 23, 2016

(30) Foreign Application Priority Data
Dec. 19, 2014    (CN) .......................... 2014 1 0798353

(51) Int. Cl.
*G02F 1/1343* (2006.01)
*G02F 1/1362* (2006.01)
(Continued)

(52) U.S. Cl.
CPC ........ *H01L 27/1218* (2013.01); *G02F 1/1368* (2013.01); *G02F 1/13439* (2013.01); *G02F 1/133345* (2013.01); *G02F 1/134309* (2013.01); *G02F 1/136227* (2013.01); *G02F 1/136286* (2013.01); *G02F 2001/134372* (2013.01); *G02F 2001/136295* (2013.01);
(Continued)

(58) Field of Classification Search
None
See application file for complete search history.

(56) References Cited

U.S. PATENT DOCUMENTS

2009/0108259 A1* 4/2009 Lin ................... G02F 1/134363
257/59
2010/0220255 A1* 9/2010 Song ................. G02F 1/134363
349/46

(Continued)

*Primary Examiner* — Ryan Crockett
(74) *Attorney, Agent, or Firm* — Hauptman Ham, LLP

(57) ABSTRACT

An FFS array substrate and a liquid crystal display device having the same are disclosed. The FFS array substrate includes a substrate, first metal layer, a first insulated layer, a second metal layer, a second insulated layer, a transparent electrode layer, a third insulated layer and a common-electrode layer. The common-electrode layer includes a common-electrode line having a low resistivity and a transparent common electrode. The FFS array substrate ensures the stability of electrical potential on common electrode and enhances the display effect of the liquid crystal display device.

15 Claims, 6 Drawing Sheets

(51) Int. Cl.
*H01L 23/50* (2006.01)
*H01L 27/12* (2006.01)
*G02F 1/1333* (2006.01)
*G02F 1/1368* (2006.01)

(52) U.S. Cl.
CPC ........ *G02F 2201/40* (2013.01); *H01L 27/124* (2013.01); *H01L 27/1248* (2013.01)

(56) References Cited

U.S. PATENT DOCUMENTS

| | | | | |
|---|---|---|---|---|
| 2012/0133865 | A1* | 5/2012 | Yonemura | G02F 1/133512 349/96 |
| 2013/0162938 | A1* | 6/2013 | Zhou | H01L 27/124 349/139 |
| 2013/0257700 | A1* | 10/2013 | Chang | G02F 1/134363 345/87 |
| 2014/0168045 | A1* | 6/2014 | Jiang | G02F 1/136286 345/92 |
| 2016/0178978 | A1* | 6/2016 | Hao | G02F 1/134363 349/43 |

\* cited by examiner

FFS ARRAY SUBSTRATE AND LIQUID CRYSTAL DISPLAY DEVICE HAVING THE SAME

BACKGROUND OF THE INVENTION

Field of the Invention

The present invention relates to the field of liquid crystal display technology, and more particularly to an FFS array substrate and a liquid crystal display device having the same.

Description of the Related Art

Liquid crystal display devices are the most widely used flat display apparatuses at present time, and may be provided as high resolution colored screens for all kinds of electronic devices, such as mobile phones, personal digital assistant (PDA), digital cameras and computers. In those liquid crystal display devices, the fringe field switching (hereinafter "FFS") type liquid crystal display device is popular due to its characteristics, such as wide viewing angle and high aperture ratio.

A widely used FFS liquid crystal display device at present time usually includes a top substrate, a bottom substrate and a liquid crystal layer mounted between the top and bottom substrates, wherein the bottom substrate is generally provided with a plurality of flat pixel electrodes and a common electrode with slit structures so as to achieve a better display function.

In the mean time, in order to avoid the problem that the viewing angles of the liquid crystal display device are too narrow, each pixel has multiple areas having a slit structure, wherein the slit structures in different areas extend in different directions so as to form multiple display domains. Liquid crystal molecules under different display domains will pre-tilt in different directions so that the angle of the light projected from the liquid crystal layer is widened, thereby achieving a wide-viewing-angle display effect for the liquid crystal display device.

Moreover, in order to increase the aperture ratio of the liquid crystal display device, the common electrode provided on the bottom substrate is usually a transparent electrode; however, the transparent electrode has a larger resistance which leads to an unstable electrical potential for the common electrode when a large amount of electric current passing through the common electrode.

Therefore, it is necessary to provide an FFS array substrate and a liquid crystal display device having the same to overcome the problems existing in the conventional technology.

SUMMARY OF THE INVENTION

An object of the present invention is to provide an FFS array substrate and a liquid crystal display device having the same which have a common electrode having a stable electrical potential so as to solve the problem of unstable electrical potential occurring in the common electrode of the liquid crystal display device in the prior art.

In order to solve the foregoing technical problem, the present invention provides an FFS array substrate. The FFS array substrate comprises:

a substrate;

a first metal layer mounted on the substrate to form a scanning line and a gate electrode of a thin-film transistor;

a first insulated layer mounted on the first metal layer to insulate the first metal layer and a second metal layer from each other, wherein the second metal layer is mounted on the first insulated layer to form a data line, a source electrode of the thin-film transistor and a drain electrode of the thin-film transistor;

a second insulated layer mounted on the second metal layer to insulate the second metal layer and a transparent electrode layer from each other, wherein the transparent electrode layer is mounted on the second insulated layer to form a transparent pixel electrode; and the transparent pixel electrode is connected to the drain electrode of the thin-film transistor via a first through hole of the second insulated layer; and a third insulated layer mounted on the transparent electrode layer to insulate the transparent electrode layer and a common electrode layer from each other, wherein the common-electrode layer includes a common-electrode line formed on the third insulated layer and a transparent common electrode formed on the common-electrode line and the third insulated layer; wherein a resistivity of the common-electrode line is smaller than that of the transparent common electrode.

In one embodiment of the FFS array substrate of the present invention, the transparent common electrode has a plurality of slit structures formed thereon.

In one embodiment of the FFS array substrate of the present invention, the FFS array substrate has multiple display domains.

In one embodiment of the FFS array substrate of the present invention, the slit structures on the transparent common electrode within different display domains extend in different directions.

In one embodiment of the FFS array substrate of the present invention, the common-electrode line is mounted in a position corresponding to a junction of the adjacent display domains.

In one embodiment of the FFS array substrate of the present invention, the second metal layer is further provided with a common line for providing a common signal, wherein the common-electrode line is connected to the common line on the second metal layer by passing through the third insulated layer, the transparent electrode layer and a second through hole of the second insulated layer.

The present invention further provides another FFS array substrate comprising:

a substrate;

a first metal layer mounted on the substrate to form a scanning line and a gate electrode of a thin-film transistor;

a first insulated layer mounted on the first metal layer to insulate the first metal layer and the second metal layer from each other, and insulate the first metal layer and a transparent electrode layer from each other;

a second metal layer mounted on the first insulated layer to form a data line, a source electrode of the thin-film transistor and a drain electrode of the thin-film transistor; wherein the transparent electrode layer is mounted on the first insulated layer to form a transparent pixel electrode, wherein the transparent pixel electrode is connected to the drain electrode of the thin-film transistor; and a second insulated layer mounted on the second metal layer and the transparent electrode layer to insulate the second metal layer and a common-electrode layer from each other and to insulate the transparent electrode layer and the common-electrode layer from each other; wherein the common-electrode layer includes a common-electrode line formed on the second insulated layer and a transparent common electrode formed on the common-electrode line and the second insulated layer; wherein a resistivity of the common-electrode line is smaller than that of the transparent common electrode.

In one embodiment of the FFS array substrate of the present invention, the transparent common electrode has a plurality of slit structures formed thereon.

In one embodiment of the FFS array substrate of the present invention, the FFS array substrate has multiple display domains.

In one embodiment of the FFS array substrate of the present invention, the slit structures on the transparent common electrode within different display domains extend in different directions.

In one embodiment of the FFS array substrate of the present invention, the common-electrode line is mounted in a position corresponding to a junction of the adjacent display domains.

In one embodiment of the FFS array substrate of the present invention, the first metal layer is further provided with a common line for providing a common signal, wherein the common-electrode line is connected to the common line on the first metal layer by passing through the second insulated layer, the transparent electrode layer and a through hole of the first insulated layer.

The present invention further provides a liquid crystal display device having an FFS array substrate, comprising a top substrate, an FFS array substrate and a liquid crystal layer mounted between the top substrate and the FFS array substrate; wherein the FFS array substrate includes:

a substrate;

a first metal layer mounted on the substrate to form a scanning line and a gate electrode of a thin-film transistor;

a first insulated layer mounted on the first metal layer to insulate the first metal layer and a second metal layer from each other; wherein the second metal layer is mounted on the first insulated layer to form a data line, a source electrode of the thin-film transistor and a drain electrode of the thin-film transistor;

a second insulated layer mounted on the second metal layer to insulate the second metal layer and a transparent electrode layer from each other; wherein the transparent electrode layer is mounted on the second insulated layer to form a transparent pixel electrode, wherein the transparent pixel electrode is connected to the drain electrode of the thin-film transistor through a first through hole of the second insulated layer; and a third insulated layer mounted on the transparent electrode layer to insulate the transparent electrode layer and a common-electrode layer; wherein the common-electrode layer includes a common-electrode line formed on the third insulated layer and a transparent common electrode formed on the common-electrode line and the third insulated layer; wherein a resistivity of the common-electrode line is smaller than that of the transparent common electrode.

In one embodiment of the liquid crystal display device of the present invention, the transparent common electrode has a plurality of slit structures formed thereon.

In one embodiment of the liquid crystal display device of the present invention, the FFS array substrate has multiple display domains.

In one embodiment of the liquid crystal display device of the present invention, the slit structures on the transparent common electrode within different display domains extend in different directions.

In one embodiment of the liquid crystal display device of the present invention, the common-electrode line is mounted in a position corresponding to a junction of the adjacent display domains.

In one embodiment of the liquid crystal display device of the present invention, the common-electrode line is connected to the common line on the second metal layer by passing through the third insulated layer, the transparent electrode layer and a second through hole of the second insulated layer.

Compared with the conventional FFS array substrate and liquid crystal display device, the FFS array substrate of the present invention, by being provided with a common-electrode layer having common-electrode lines and transparent common electrodes, insures the stability of electrical potential on the common electrode and enhance the display effect of the corresponding liquid crystal display device, thereby solving the problem of unstable electrical potential occurring in the common electrode of the liquid crystal display device of the prior art.

In order to make the contents of the present invention more easily understood, the preferred embodiments of the present invention are described in detail, in cooperation with accompanying drawings, as follows.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

As used herein, the singular forms "a" and "an" are intended to include the plural forms as well, unless the context clearly indicates otherwise.

Figure 1A:
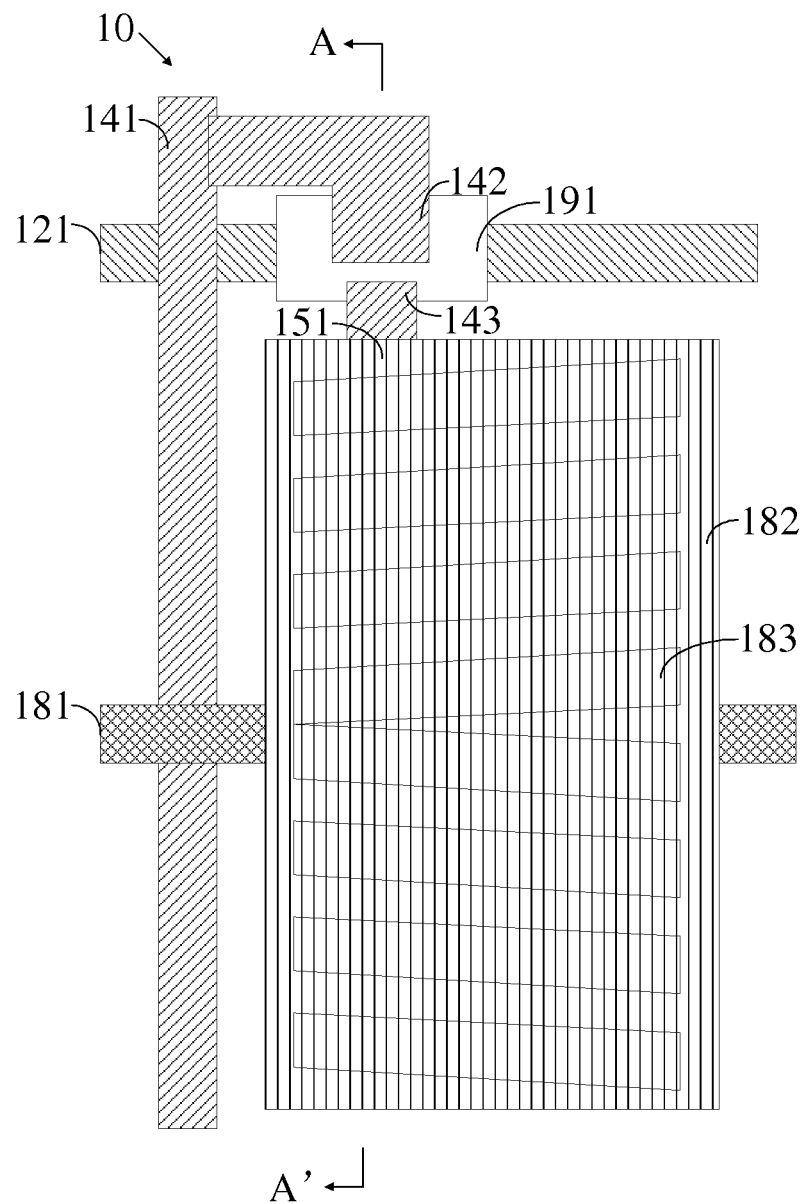
FIG. 1A is a schematic diagram showing the top view of an FFS array substrate according to a first embodiment of the present invention.
Figure 1B:
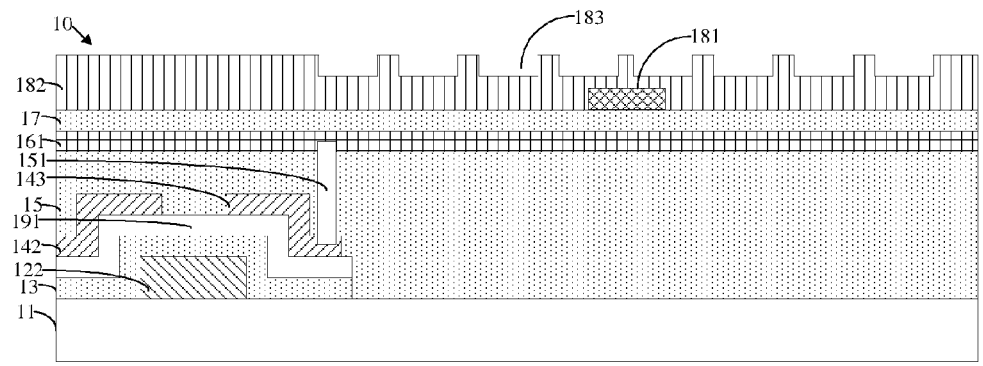
FIG. 1B is a cross-sectional view taken along the line A-A' of FIG. 1A.

With reference to FIG. 1A and FIG. 1B, FIG. 1A is a schematic diagram showing the top view of an FFS array substrate according to a first embodiment of the present invention; and FIG. 1B is a cross-sectional view taken along the line A-A' of FIG. 1A. The FFS array substrate 10 of the present invention comprises a substrate 11, a first metal layer, a first insulated layer 13, a second metal layer, a second insulated layer 15, a transparent electrode layer, a third insulated layer 17 and a common-electrode layer.

The first metal layer is mounted on the substrate 11 to form a scanning line 121 and a gate electrode 122 of a thin-film transistor. The first insulated layer 13 is mounted on the first metal layer to insulate the first metal layer and the second metal layer. The second metal layer is mounted on the first insulated layer 13 to form a data line 141, a source electrode 142 of the thin-film transistor and a drain electrode 143 of the thin-film electrode. The second insulated layer 15 is mounted on the second metal layer to insulate the second metal layer and the transparent electrode layer. The transparent electrode layer is mounted on the second insulated layer 15 to form a transparent pixel electrode 161. The transparent pixel electrode 161 is connected to the drain electrode 143 of the thin-film transistor via a first through hole 151 of the second insulated layer 15. The third insulated layer 17 is mounted on transparent electrode layer to insulate the transparent electrode layer and the common-electrode layer. The common-electrode layer includes a common-electrode line 181 mounted on the third insulated layer 17 and a transparent common electrode 182 formed on the common-electrode line 181 and the third insulated layer 17, wherein a resistivity of the common-electrode line 181 is relatively smaller than that of the transparent common electrode 182. Besides, the FFS array substrate 10 further has a semiconductor layer which is used to form a channel 191 of the thin-film transistor.

The FFS array substrate 10 in the embodiment has multiple display domains. The transparent common electrode 182 of the FFS array substrate 10 has a plurality of slit structures 183 formed thereon. The slit structures 183 on the transparent common electrode 182 within different display domains of the FFS array substrate 10 extend in different directions. The common-electrode line 181 is mounted in a position corresponding to a junction of the adjacent display domains.

When the FFS array substrate 10 in this embodiment is working, the transparent pixel electrode 161 on the transparent electrode layer receives a data signal from the data line 141 through the first through hole 151, the drain electrode 143 of the thin-film transistor and the source electrode 142 of the thin-film transistor. The transparent common electrode 182 on the common-electrode layer receives a common signal through the common-electrode line 181. The liquid crystal molecules in the liquid crystal layer of the liquid crystal display device tilt under the influence of the data signal and the common signal so that the liquid crystal display device displays a corresponding image.

Since the common-electrode line 181 is a metal line with a lower resistivity, the resistance of the common electrode as a whole can be further reduced so that the electrical potential on the common electrode can be more stable and more even.

In the meantime, since the junction of the adjacent display domains is a poor display area where the display effect is relatively poor, forming the common-electrode line 181 which is opaque in the position corresponding to the junction of the adjacent display domains can prevent the common-electrode line 181 from causing too much influence on the aperture ratio of the liquid crystal display device. Therefore, the resistance of the common electrode can be reduced with only a slight influence on the aperture ratio of the liquid crystal display device.

Furthermore, with the common-electrode line 181 passing through each pixel of the liquid crystal display device, when the surface of the liquid crystal display device is provided with touch-sensing components, the common-electrode line can be used to transmit touch-sensing signals.

Thus, the FFS array substrate in this embodiment can ensure the stability of electrical potential on the common electrode by forming a common-electrode layer having a common-electrode line and a transparent common electrode so that the display effect of the liquid crystal display device is enhanced.

Figure 2A:
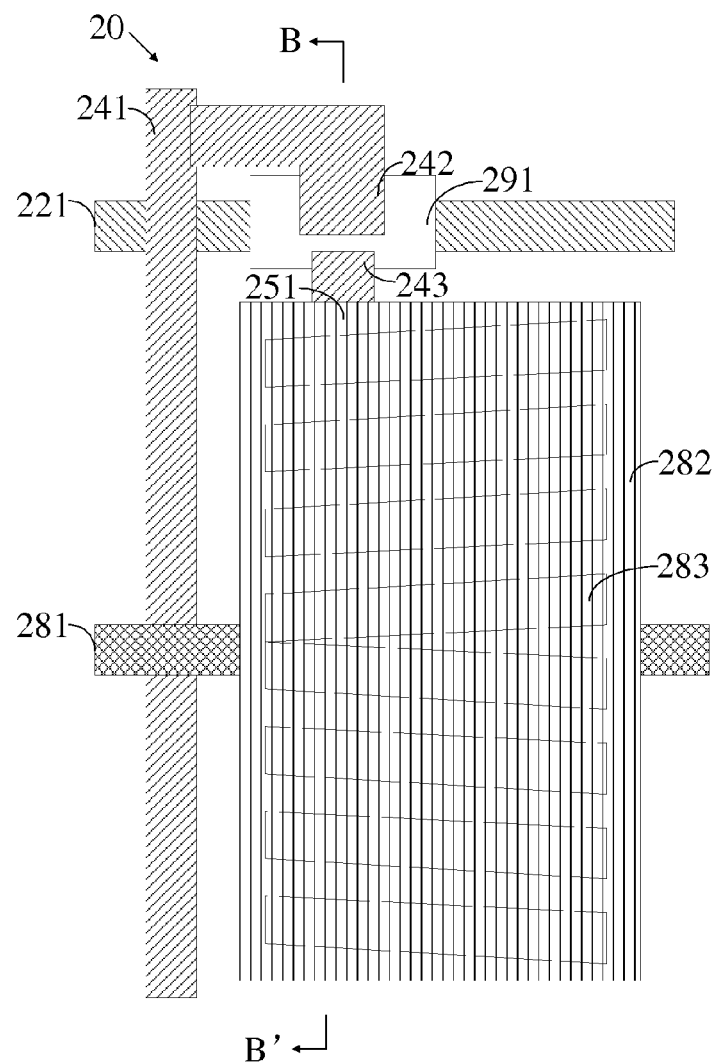
FIG. 2A is a schematic diagram showing the top view of the FFS array substrate according to a second embodiment of the present invention.
Figure 2B:
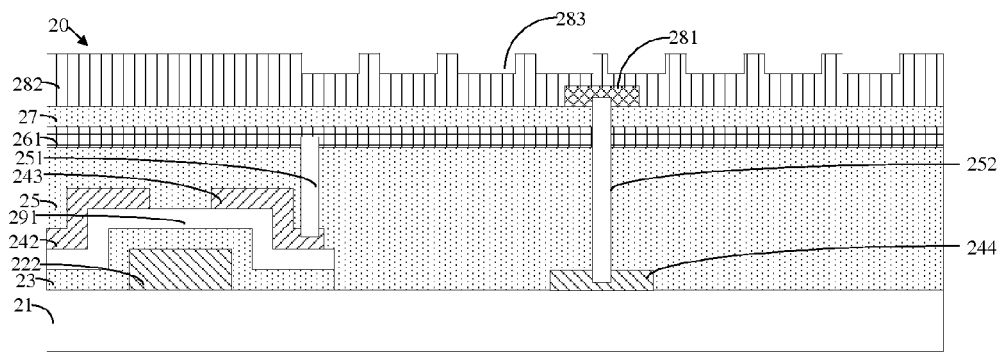
FIG. 2B is a cross-sectional view taken along the line B-B' of FIG. 2A.

With further reference to FIG. 2A and FIG. 2B, FIG. 2A is a schematic diagram showing the top view of the FFS array substrate according to a second embodiment of the present invention; and FIG. 2B is a cross-sectional view taken along the line B-B' of FIG. 2A. The FFS array substrate 20 in the second embodiment comprises a substrate 21, a first metal layer, a first insulated layer 23, a second metal layer, a second insulated layer 25, a transparent electrode layer, a third insulated layer 27 and a common-electrode layer.

The first metal layer is mounted on the substrate 21 to form a scanning line 221 and a gate electrode 222 of a thin-film transistor. The first insulated layer 23 is mounted on the first metal layer to insulate the first metal layer and the second metal layer from each other. The second metal layer is mounted on the first insulated layer 23 to form a data line 241, a source electrode 242 of the thin-film transistor and a drain electrode 243 of the thin-film transistor. The second insulated layer 25 is mounted on the second metal layer to insulate the second metal layer and the transparent electrode layer from each other. The transparent electrode layer is mounted on the second insulated layer 25 to form a transparent pixel electrode 261, wherein the transparent pixel electrode 261 is connected to the drain electrode 243 of the thin-film transistor via a first through hole 251 of the second insulated layer 25. The third insulated layer 27 is mounted on the transparent electrode layer to insulate the transparent electrode layer and the common-electrode layer from each other. The common-electrode layer includes a common-electrode line 281 formed on the third insulated layer 27 and a transparent common electrode 282 formed on the common-electrode line 281 and the third insulated layer 27, wherein a resistivity of the common-electrode line 281 is relatively smaller than that of the transparent common electrode 282. Besides, the FFS array substrate 20 further includes a semiconductor layer which is used to form a channel 291 of the thin-film transistor.

The FFS array substrate 20 in the embodiment has multiple display domains. The transparent common electrode 282 of the FFS array substrate 20 has a plurality of slit structures 283 formed thereon. The slit structures 283 on the transparent common electrode 282 within different display domains of the FFS array substrate 20 extend in different directions. The common-electrode line 281 is mounted in a position corresponding to a junction of the adjacent display domains.

On the basis of the first embodiment, the second metal layer of the FFS array substrate 20 in the second embodiment is further provided with a common line 244 for providing a common signal, wherein the common-electrode line 281 of the common-electrode layer is connected to the common line 244 on the second metal layer by passing through the third insulated layer 27, the transparent electrode layer and a second through hole 252 of the second insulated layer 25. However, the common line 244 can also be mounted on the first metal layer.

When the FFS array substrate 20 in the second embodiment is working, the transparent pixel electrode 261 on the transparent electrode layer receives a data signal from the data line 241 through the first through hole 251, the drain electrode 243 of the thin-film transistor and the source electrode 242 of the thin-film transistor. The transparent common electrode 282 on the common-electrode layer receives a common signal from the common line 244 on the second metal layer through the common-electrode line 281 on the common-electrode layer and the second through hole 252. The liquid crystal molecules in the liquid crystal layer of the liquid crystal display device tilt under the influence of the data signal and the common signal so that the liquid crystal display device displays a corresponding image.

In the FFS array substrate of the second embodiment, by using the common line of the second metal layer to transmit the common signal, the common-electrode line of the common-electrode layer does not have to pass through the whole structure of the liquid crystal display device. Thus, the forming of the common-electrode line can do even less influence on the aperture ratio of the liquid crystal display device.

Figure 3A:
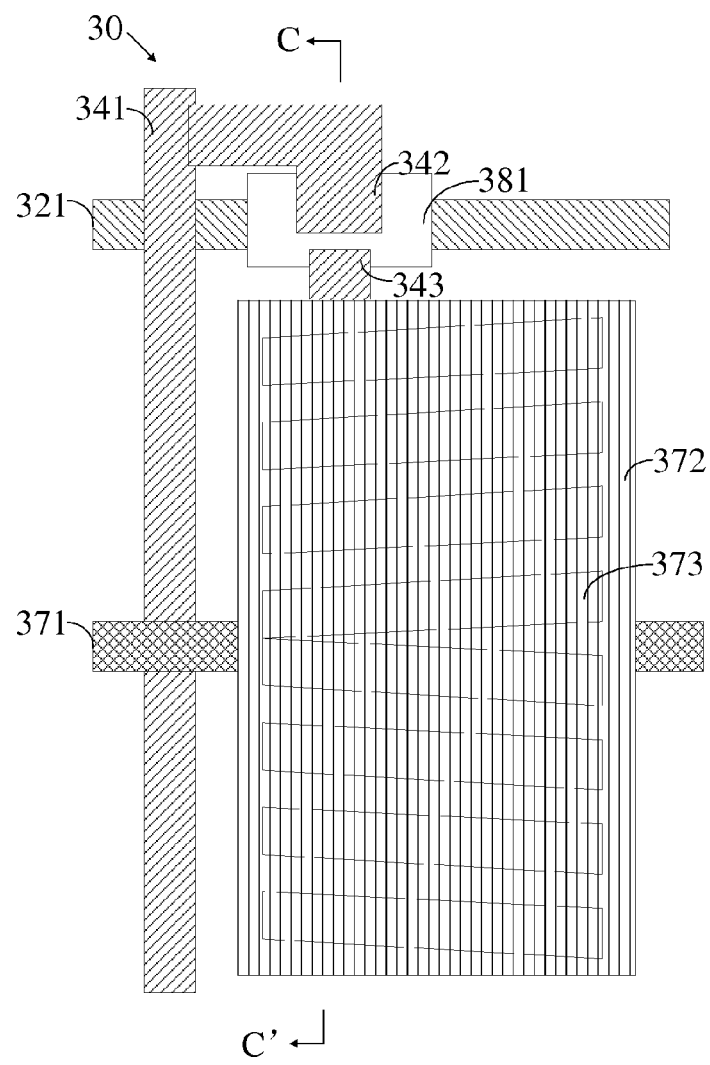
FIG. 3A is a schematic diagram showing the top view of the FFS array substrate according to a third embodiment of the present invention.
Figure 3B:
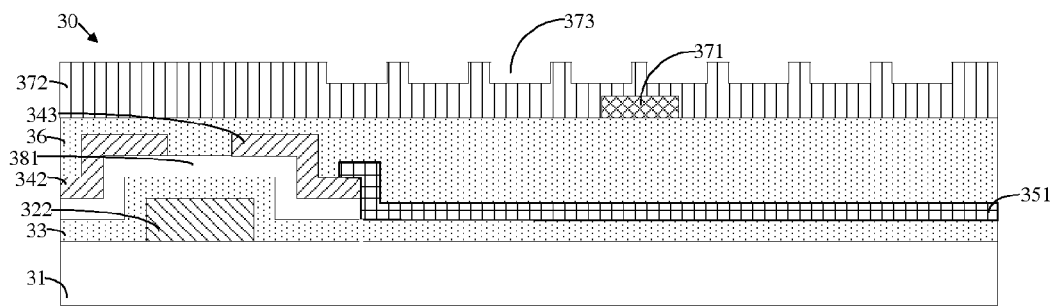
FIG. 3B is a cross-sectional view taken along the line C-C' of FIG. 3A.

With further reference to FIG. 3A and FIG. 3B, FIG. 3A is a schematic diagram showing the top view of the FFS array substrate according to a third embodiment of the present invention; and FIG. 3B is a cross-sectional view taken along the line C-C' of FIG. 3A. The FFS array substrate 30 in the third embodiment comprises a substrate 31, a first metal layer, a first insulated layer 33, a second metal layer, a transparent electrode layer, a second insulated layer 36 and a common-electrode layer.

The first metal layer is mounted on the substrate 31 to form a scanning line 321 and a gate electrode 322 of a thin-film transistor. The first insulated layer 33 is mounted on the first metal layer to insulate the first metal layer and the second metal layer from each other, and insulate the first metal layer and the transparent electrode layer from each other. The second metal layer is mounted on the first insulated layer 33 to form a data line 341, a source electrode 342 of the thin-film transistor and a drain electrode 343 of the thin-film transistor. The transparent electrode layer is mounted on the first insulated layer 33 to form a transparent pixel electrode 351, wherein the transparent pixel electrode 351 is connected to the drain electrode 343 of the thin-film transistor on the second metal layer. The second insulated layer 36 is mounted on the second metal layer and the transparent electrode layer to insulate the transparent electrode layer and the common-electrode layer from each other, and insulate the second metal layer and the common-electrode layer from each other. The common-electrode layer consists of a common-electrode line 371 formed on the second insulated layer 36 and a transparent common electrode 372 formed on the common-electrode line 371 and the second insulated layer 36, wherein a resistivity of the common-electrode line 371 is relatively smaller than that of the transparent common electrode 372. Besides, the FFS array substrate 30 further has a semiconductor layer which is used to form a channel 381 of the thin-film transistor.

The FFS array substrate 30 in the embodiment has multiple display domains. The transparent common electrode 372 of the FFS array substrate 30 has a plurality of slit structures 373 formed thereon. The slit structures 373 on the transparent common electrode 372 within different display domains of the FFS array substrate 30 extend in different directions. The common-electrode line 371 is mounted in a position corresponding to a junction of the adjacent display domains.

When the FFS array substrate 30 of the third embodiment is working, the transparent pixel electrode 351 of the transparent electrode layer receives a data signal from the data line 341 through the drain electrode 343 of the thin-film transistor and the source electrode 342 of the thin-film transistor. The transparent common electrode 372 of the common-electrode layer receives a common signal from the common-electrode line 371. The liquid crystal molecules in the liquid crystal layer of the liquid crystal display device tilt under the influence of the data signal and the common signal so that the liquid crystal display device displays a corresponding image.

Since the common-electrode line 371 is a metal line with a lower resistivity, the resistance of the common electrode as a whole can be further reduced so that the electrical potential on the common electrode can be more stable and more even.

In the meantime, since the junction of the adjacent display domains is a poor display area where the display effect is relatively poor, forming the common-electrode line 371 which is opaque in the position corresponding to the junction of the adjacent display domains can prevent the common-electrode line 371 from causing too much influence on the aperture ratio of the liquid crystal display device. Therefore, the resistance of the common electrode can be reduced with only a slight influence on the aperture ratio of the liquid crystal display device.

Furthermore, with the common-electrode line 371 passing through each pixel of the liquid crystal display device, when the surface of the liquid crystal display device is provided with touch-sensing components, the common-electrode line can be used to transmit touch-sensing signals.

Thus, the FFS array substrate in this embodiment can also ensure the stability of electrical potential on the common electrode by forming a common-electrode layer having a common-electrode line and a transparent common electrode so that the display effect of the liquid crystal display device is enhanced.

Figure 4A:
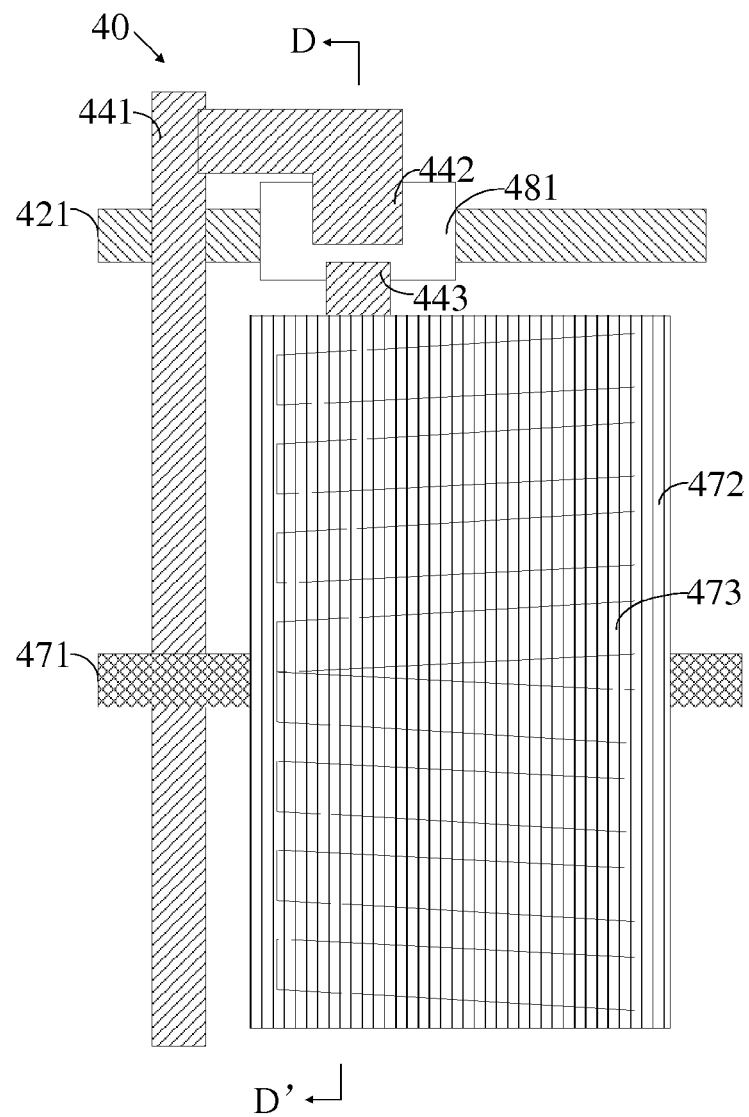
FIG. 4A is a schematic diagram showing the top view of the FFS array substrate according to a fourth embodiment of the present invention.
Figure 4B:
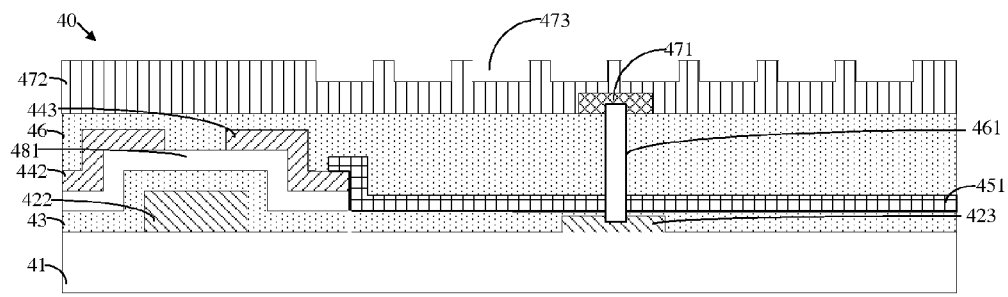
FIG. 4B is a cross-sectional view taken along the line D-D' of FIG. 4A.

With further reference to FIG. 4A and FIG. 4B, FIG. 4A is a schematic diagram showing the top view of the FFS array substrate according to a fourth embodiment of the present invention; and FIG. 4B is a cross-sectional view taken along the line D-D' of FIG. 4A. The FFS array substrate 40 of the fourth embodiment comprises a substrate 41, a first metal layer, a first insulated layer 43, a second metal layer, a transparent electrode layer, a second insulated layer 46 and a common-electrode layer.

The first metal layer is mounted on the substrate 41 to form a scanning line 421 and a gate electrode 422 of a thin-film transistor. The first insulated layer 43 is mounted on the first metal layer to insulate the first metal layer and the second metal layer from each other, and insulate the first metal layer and the transparent electrode layer from each other. The second metal layer is mounted on the first insulated layer 43 to form a data line 441, a source electrode 442 of the thin-film transistor and a drain electrode 443 of the thin-film transistor. The transparent electrode layer is mounted on the first insulated layer 43 to form a transparent pixel electrode 451, wherein the transparent pixel electrode 451 is connected to the drain electrode 443 of the thin-film transistor on the second metal layer. The second insulated layer 46 is mounted on the second metal layer and the transparent electrode layer to insulate the transparent electrode layer and the common-electrode layer from each other, and insulate the second metal layer and the common-electrode layer from each other. The common-electrode layer consists of a common-electrode line 471 formed on the second insulated layer 46 and a transparent common electrode 472 formed on the common-electrode line 471 and the second insulated layer 46, wherein a resistivity of the common-electrode line 471 is relatively smaller than that of the transparent common electrode 472. Besides, the FFS array substrate 40 further has a semiconductor layer which is used to form a channel 481 of the thin-film transistor.

The FFS array substrate 40 in the embodiment has multiple display domains. The transparent common electrode 472 of the FFS array substrate 40 has a plurality of slit structures 473 formed thereon. The slit structures 473 on the transparent common electrode 472 within different display domains of the FFS array substrate 40 extend in different directions. The common-electrode line 471 is mounted in a position corresponding to a junction of the adjacent display domains.

On the basis of the third embodiment, the first metal layer of the FFS array substrate 40 in the fourth embodiment is further provided with a common line 423 for providing a common signal, wherein the common-electrode line 471 of the common-electrode layer is connected to the common line 423 on the first metal layer by passing through the second insulated layer 46, the transparent electrode layer and a through hole 461 of the first insulated layer 43.

When the FFS array substrate 40 of the fourth embodiment is working, the transparent pixel electrode 451 of the transparent electrode layer receives a data signal from the data line 441 through the drain electrode 443 of the thin-film transistor and the source electrode 442 of the thin-film transistor. The transparent common electrode 472 of the common-electrode layer receives a common signal from the common line 423 through the common-electrode line 471 and a through hole 461. The liquid crystal molecules in the liquid crystal layer of the liquid crystal display device tilt under the influence of the data signal and the common signal so that the liquid crystal display device displays a corresponding image.

In the FFS array substrate of the fourth embodiment, by using the common line of the first metal layer to transmit the common signal, the common-electrode line of the common-electrode layer does not have to go through the whole structure of the liquid crystal display device. Thus, the forming of the common-electrode line can do even less influence on the aperture ratio of the liquid crystal display device.

Figure 5:
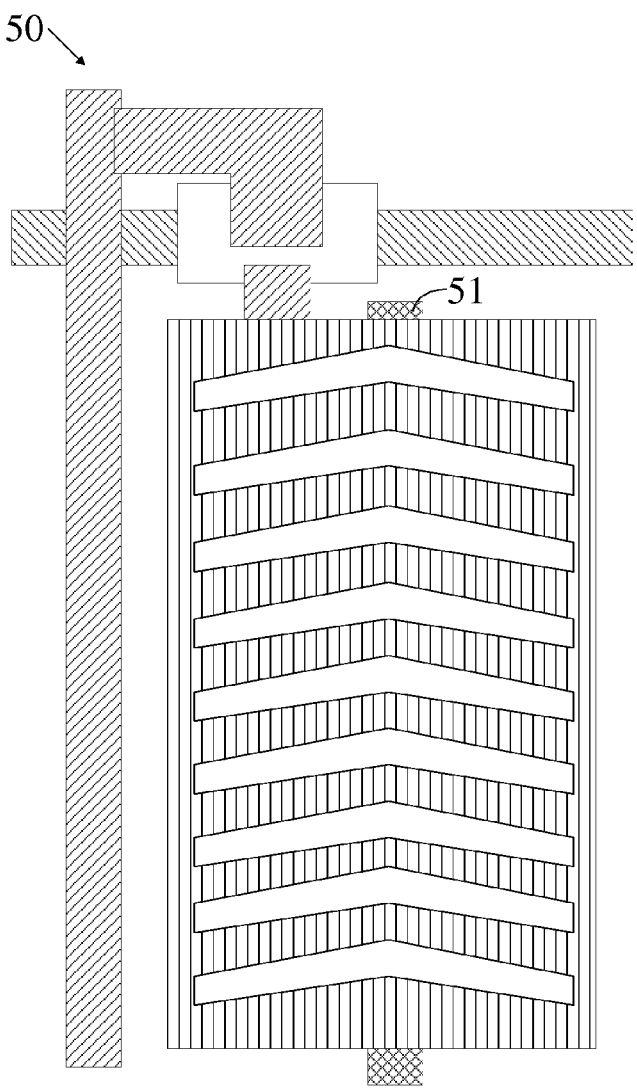
FIG. 5 is a schematic diagram showing the top view of the FFS array substrate according to a fifth embodiment of the present invention.
Figure 6:
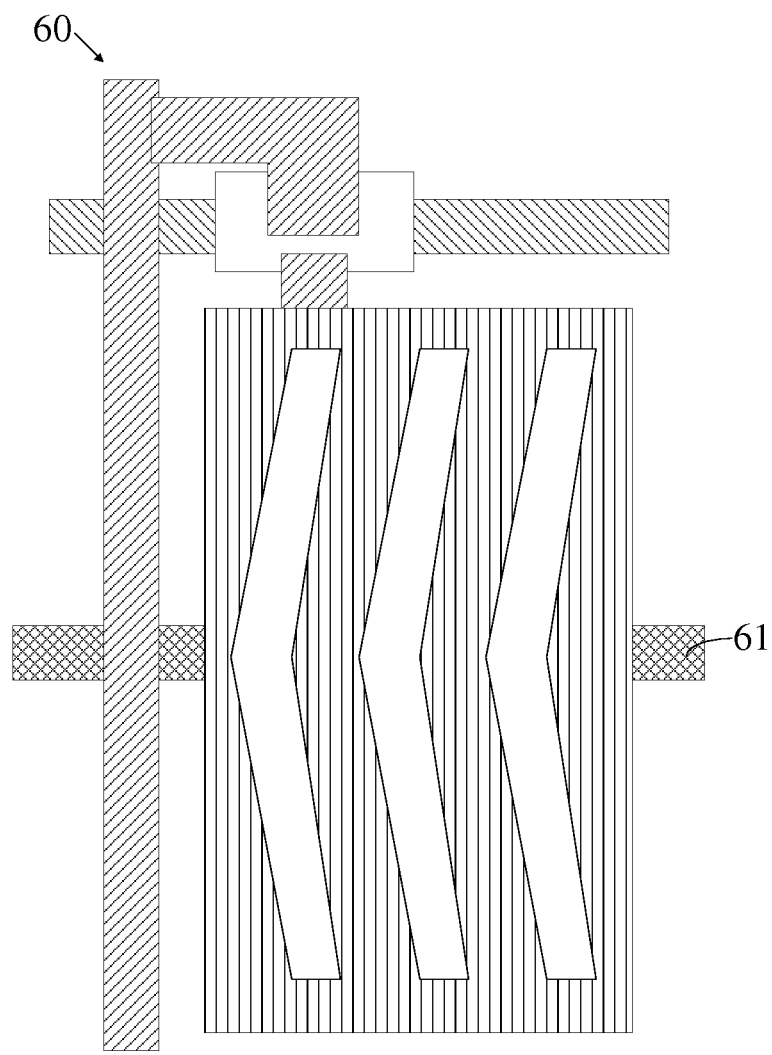
FIG. 6 is a schematic diagram showing the top view of the FFS array substrate according to a sixth embodiment of the present invention.

The FFS array substrate of the present invention includes multiple display domains, wherein the display domains may be divided in a way according to the requirements of the clients or a practical situation. With reference to FIG. 5, a schematic diagram showing the top view of the FFS array substrate according to a fifth embodiment of the present invention, in the FFS array substrate 50 of this embodiment each pixel has two display domains at left side and right side, respectively. Therefore, the common-electrode line 51 is preferably mounted in a position corresponding to a top-to-down center line of each pixel. With further reference to FIG. 6, a schematic diagram showing the top view of the FFS array substrate according to a sixth embodiment of the present invention, in the FFS array substrate 60 of this embodiment each pixel has two display domains at top side and bottom side, respectively. Therefore, the common-electrode line 61 is preferably mounted in a position corresponding to a left-to-right center line of each pixel.

However, the mounting position of the common-electrode line certainly will differ based on the arrangement of display domains, and should not be limited to the foregoing embodiments. As long as the common-electrode line is mounted on the junction of the adjacent display domains, the effect of greatly reducing the resistance of common electrode and enhancing the aperture ratio of liquid crystal display device can be achieved.

The present invention further provides a liquid crystal display device. The liquid crystal display device comprises a top substrate, an FFS array substrate as described above and a liquid crystal layer mounted between the top substrate and the FFS array substrate. The specific structure and working theory of the FFS array substrate is substantially identical or similar to the descriptions of the preferred embodiments of the FFS array substrate, as described above, so that the detailed description thereof will be omitted herein.

The FFS array substrate of the present invention, by being provided with a common-electrode layer having common-electrode lines and transparent common electrodes, insures the stability of electrical potential on the common electrode and enhance the display effect of the corresponding liquid crystal display device, thereby solving the problem of unstable electrical potential occurring in the common electrode of the liquid crystal display device of the prior art.

The present invention has been described with preferred embodiments thereof, and it is understood that many changes and modifications to the described embodiment can be carried out without departing from the scope and the spirit of the invention that is intended to be limited only by the appended claims.

What is claimed is:

1. An FFS array substrate comprising:
a substrate;
a first metal layer mounted on the substrate to form a scanning line and a gate electrode of a thin-film transistor;
a first insulated layer mounted on the first metal layer to insulate the first metal layer and a second metal layer from each other, wherein the second metal layer is mounted on the first insulated layer to form a data line, a source electrode of the thin-film transistor and a drain electrode of the thin-film transistor;
a second insulated layer mounted on the second metal layer to insulate the second metal layer and a transparent electrode layer from each other, wherein the transparent electrode layer is mounted on the second insulated layer to form a transparent pixel electrode; and the transparent pixel electrode is connected to the drain electrode of the thin-film transistor via a first through hole of the second insulated layer; and
a third insulated layer mounted on the transparent electrode layer to insulate the transparent electrode layer and a common electrode layer from each other, wherein the common-electrode layer includes a common-electrode line formed on the third insulated layer and a transparent common electrode formed on the common-electrode line and the third insulated layer; wherein a resistivity of the common-electrode line is smaller than that of the transparent common electrode, wherein
the second metal layer is further provided with a common line for providing a common signal, and
the common-electrode line is connected to the common line on the second metal layer by passing through the third insulated layer, the transparent electrode layer and a second through hole of the second insulated layer.

2. The FFS array substrate as claimed in claim 1, wherein the transparent common electrode has a plurality of slit structures formed thereon.

3. The FFS array substrate as claimed in claim 1, wherein the FFS array substrate has multiple display domains.

4. The FFS array substrate as claimed in claim 3, wherein the slit structures on the transparent common electrode within different display domains extend in different directions.

5. The FFS array substrate as claimed in claim 3, wherein the common-electrode line is mounted in a position corresponding to a junction of the adjacent display domains.

6. An FFS array substrate comprising:
a substrate;
a first metal layer mounted on the substrate to form a scanning line and a gate electrode of a thin-film transistor;
a first insulated layer mounted on the first metal layer to insulate the first metal layer and a second metal layer from each other, and insulate the first metal layer and a transparent electrode layer from each other;
the second metal layer mounted on the first insulated layer to form a data line, a source electrode of the thin-film transistor and a drain electrode of the thin-film transistor; wherein the transparent electrode layer is mounted on the first insulated layer to form a transparent pixel electrode, wherein the transparent pixel electrode is connected to the drain electrode of the thin-film transistor; and
a second insulated layer mounted on the second metal layer and the transparent electrode layer to insulate the second metal layer and a common-electrode layer from each other and to insulate the transparent electrode layer and the common-electrode layer from each other; wherein
the common-electrode layer includes a common-electrode line formed on the second insulated layer and a transparent common electrode formed on the common-electrode line and the second insulated layer; wherein a resistivity of the common-electrode line is smaller than that of the transparent common electrode, and
the first metal layer is further provided with a common line for providing a common signal, wherein the common-electrode line is connected to the common line on the first metal layer by passing through the second insulated layer, the transparent electrode layer and a through hole of the first insulated layer.

7. The FFS array substrate as claimed in claim 6, wherein the transparent common electrode has a plurality of slit structures formed thereon.

8. The FFS array substrate as claimed in claim 6, wherein the FFS array substrate has multiple display domains.

9. The FFS array substrate as claimed in claim 8, wherein the slit structures on the transparent common electrode within different display domains extend in different directions.

10. The FFS array substrate as claimed in claim 8, wherein the common-electrode line is mounted in a position corresponding to a junction of the adjacent display domains.

11. A liquid crystal display device having an FFS array substrate, comprising a top substrate, an FFS array substrate and a liquid crystal layer mounted between the top substrate and the FFS array substrate; wherein the FFS array substrate includes:
a substrate;
a first metal layer mounted on the substrate to form a scanning line and a gate electrode of a thin-film transistor;
a first insulated layer mounted on the first metal layer to insulate the first metal layer and a second metal layer from each other; wherein the second metal layer is mounted on the first insulated layer to form a data line, a source electrode of the thin-film transistor and a drain electrode of the thin-film transistor;
a second insulated layer mounted on the second metal layer to insulate the second metal layer and a transparent electrode layer from each other; wherein the transparent electrode layer is mounted on the second insulated layer to form a transparent pixel electrode, wherein the transparent pixel electrode is connected to the drain electrode of the thin-film transistor through a first through hole of the second insulated layer; and
a third insulated layer mounted on the transparent electrode layer to insulate the transparent electrode layer and a common-electrode layer; wherein
the common-electrode layer includes a common-electrode line formed on the third insulated layer and a transparent common electrode formed on the common-electrode line and the third insulated layer; wherein a resistivity of the common-electrode line is smaller than that of the transparent common electrode, and
the second metal layer is further provided with a common line for providing a common signal, wherein the common-electrode line is connected to the common line on the second metal layer by passing through the third insulated layer, the transparent electrode layer and a second through hole of the second insulated layer.

12. The liquid crystal display device as claimed in claim 11, wherein the transparent common electrode has a plurality of slit structures formed thereon.

13. The liquid crystal display device as claimed in claim 11, wherein the FFS array substrate has multiple display domains.

14. The liquid crystal display device as claimed in claim 13, wherein the slit structures on the transparent common electrode within different display domains extend in different directions.

15. The liquid crystal display device as claimed in claim 13, wherein the common-electrode line is mounted in a position corresponding to a junction of the adjacent display domains.

* * * * *